US006334209B1

(12) United States Patent
Hashimoto et al.

(10) Patent No.: US 6,334,209 B1
(45) Date of Patent: Dec. 25, 2001

(54) METHOD FOR EXPOSURE-MASK INSPECTION AND RECORDING MEDIUM ON WHICH A PROGRAM FOR SEARCHING FOR PORTIONS TO BE MEASURED IS RECORDED

(75) Inventors: Koji Hashimoto; Shigeki Nojima, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/389,090

(22) Filed: Sep. 2, 1999

(30) Foreign Application Priority Data

Sep. 3, 1998 (JP) .................................................. 10-249867

(51) Int. Cl.[7] ........................... G06F 17/50; G06F 19/00; G06K 9/46; G06K 9/74
(52) U.S. Cl. ............................. 716/21; 382/144; 378/35; 700/110; 700/121; 700/120; 430/5; 438/14
(58) Field of Search .................... 716/19–21; 382/144; 378/35; 700/108–110, 120–121; 438/14, 16–18; 430/5

(56) References Cited

U.S. PATENT DOCUMENTS

| 3,631,772 | * | 1/1972 | Curran et al. ...................... 396/563 |
| 3,743,423 | * | 7/1973 | Heinz et al. .......................... 356/71 |
| 3,790,280 | * | 2/1974 | Heinz et al. .......................... 356/71 |
| 3,819,376 | * | 6/1974 | Land .................................... 430/215 |
| 4,639,587 | * | 1/1987 | Chadwick et al. ............... 250/201.3 |
| 4,965,842 | * | 10/1990 | Crossley et al. .................... 382/144 |
| 5,124,927 | * | 6/1992 | Hopewell et al. .................. 700/121 |
| 5,358,827 | * | 10/1994 | Garofalo et al. ................... 430/313 |
| 5,439,767 | * | 8/1995 | Yamashita et al. ................. 430/30 |
| 5,452,090 | * | 9/1995 | Progler et al. ..................... 356/401 |
| 5,789,118 | * | 8/1998 | Liu et al. ............................... 430/5 |
| 5,851,702 | * | 12/1998 | Watanabe et al. .................... 430/5 |
| 5,913,102 | * | 6/1999 | Yang .................................... 438/14 |
| 6,052,478 | * | 4/2000 | Wihl et al. ......................... 382/144 |

OTHER PUBLICATIONS

Postek et al., "A new approach to accurate X–ray mask measurements scanning electron microscope", IEEE Transactions on Electron Devices, vol. 36, No. 11, Part 2, Nov. 1989, pp. 2452–2457.*

* cited by examiner

*Primary Examiner*—Matthew Smith
*Assistant Examiner*—Phallaka Kik
(74) *Attorney, Agent, or Firm*—Finnegan, Henderson, Farabow, Garrett, & Dunner, L.L.P.

(57) ABSTRACT

Disclosed is an exposure mask inspecting method for use in manufacturing semiconductor devices. This inspecting method calculate gradients of a correlation curve of a variation in critical dimension of an exposure mask and a variation in critical dimension of a resist, extracts portions having large slopes of the correlation curve, and slopes the portions having large slopes of the correlation curve as to-be-measured portions at the time of verifying the specifications of the surface critical dimension of the exposure mask.

10 Claims, 15 Drawing Sheets

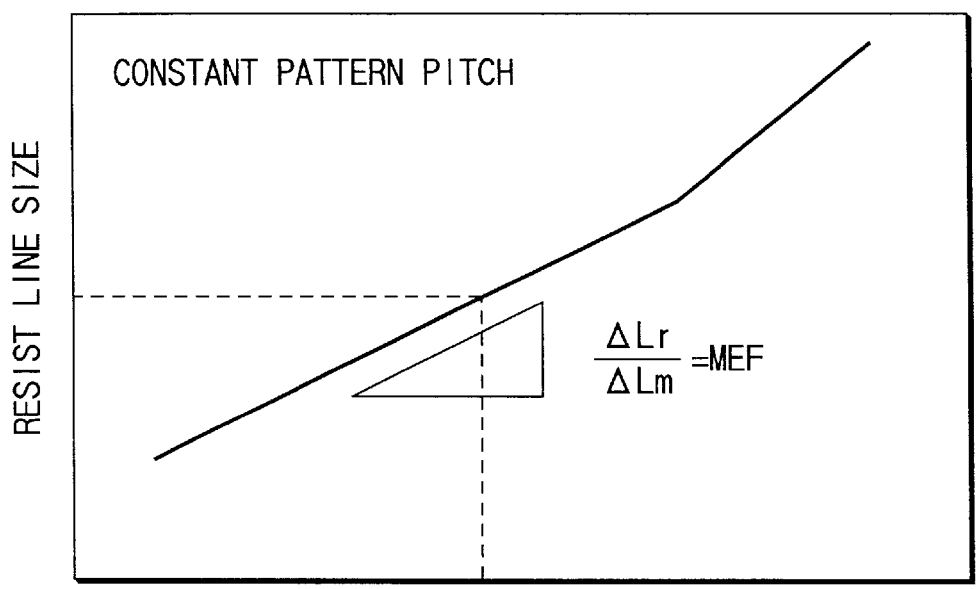
FIG. 3
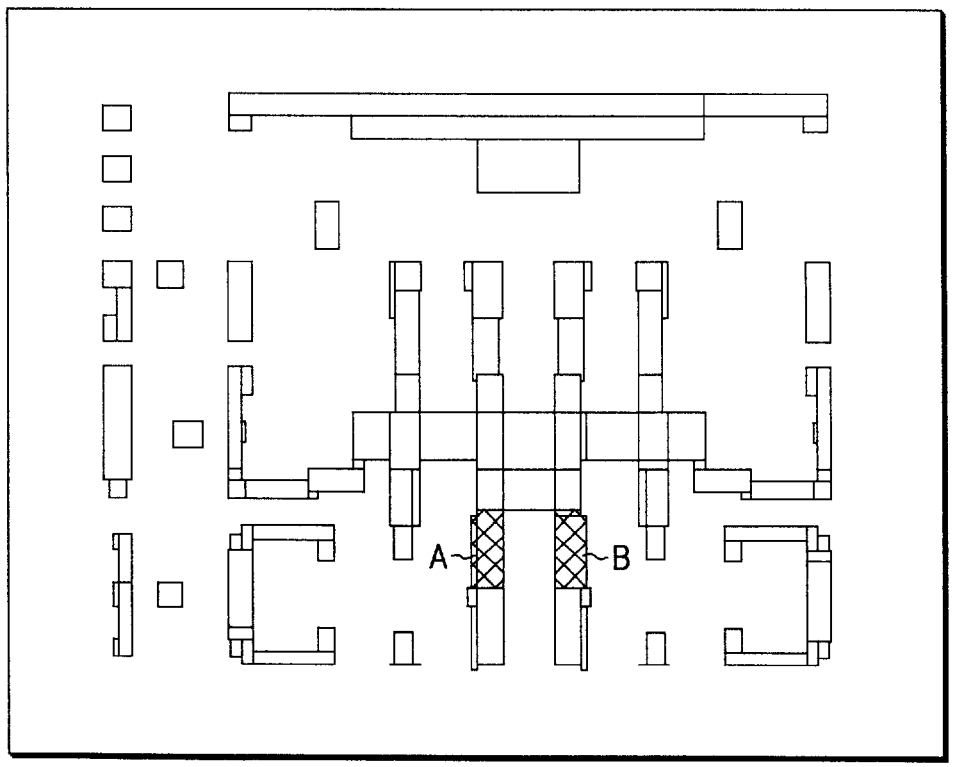
FIG. 4    ▨ $1.5 \leq$ MEF    ▢ MEF$<1.5$

METHOD FOR EXPOSURE-MASK INSPECTION AND RECORDING MEDIUM ON WHICH A PROGRAM FOR SEARCHING FOR PORTIONS TO BE MEASURED IS RECORDED

BACKGROUND OF THE INVENTION

The present invention relates to inspection of an exposure mask to be used in a lithography step for semiconductor integrated circuit devices.

The recent price cutting of memory devices leads to rapid acceleration of the miniaturization of semiconductor devices. This trend of miniaturization is seen not only on memory devices but also on logic devices such as an RISC chip which demand a fast operation. The miniaturization of some logic devices comes ahead of that of memory devices. That is, time has come when logic devices play the role of the technology driver for the miniaturization process that memory devices have served as. This trend makes it more and more important to develop the miniaturization process technology in consideration of the device characteristics of logic devices.

As miniaturization is accelerated, influence of a variation in mask CD (critical dimension) on the CD of wafer patterns can no longer be neglected. This demands more precise mask specifications (CD, defect, etc.) at the time of mask shipment becomes severe.

Conventionally, the planar specifications of the mask CDs for leading large-scale integrated memory devices like DRAMs have been verified by extracting several portions to be measured (hereinafter called "to-be-measured portions") from a memory cell section and measuring the CD of the mask at each to-be-measured portion. This scheme has been employed because the pattern of a memory cell section should meet more precise size requirements than other patterns, occupies a certain portion (50 to 60%) of the inner area of the chip and is basically formed by repetitive patterns, which makes determination of the size specifications relatively easy.

By way of contrast, a logic device basically has a random circuit pattern which, unlike the memory cell section of a memory device, is hardly formed by repetitive patterns. Therefore, the aforementioned scheme for memory devices of extracting proper to-be-measured portions from a memory cell section and measuring the CD of a mask at each to-be-measured portion cannot fundamentally be used for logic devices.

In view of such a situation, a scheme of arranging repetitive patterns for measurement, such as line and space (L/S) patterns at a kerf portion (the boundary between chips) and measuring the sizes of those patterns to verify the mask CD across the mask has been employed for existing logic devices.

However, the scheme of arranging L/S patterns for measurement at the kerf portion cannot verify the specifications of the mask CD across the mask of an exposure mask by the pattern CD of a portion that should be really verified in terms of process and device.

In addition, basically a kerf portion often becomes an edge portion of an exposure mask, so that the pattern CD in an exposure area which serves as an actual device cannot be monitored.

BRIEF SUMMARY OF THE INVENTION

Accordingly, it is an object of the present invention to provide an exposure mask inspecting method which can verify the specifications of the mask CD across the mask of even an exposure mask for a semiconductor integrated circuit device having a random circuit pattern by the CD of a portion that should really be verified, and which can monitor the pattern CD in an exposure area.

To achieve the above object, an exposure mask inspecting method according to this invention calculates slopes of a correlation curve of a variation in critical dimension of an exposure mask and a variation in critical dimension of a resist, extracts portions having large slopes of the correlation curve, and selects to-be-measured portions at which the critical dimension of the exposure mask is to-be-measured, from the extracted portions having large slopes of the correlation curve.

The extracted portions having large slopes of the correlation curve are portions where a variation in critical dimension of the resist becomes large or portions at which the critical dimension of the exposure mask should be controlled precisely.

This exposure mask inspecting method can select those portions at which strict control of the critical dimension of the exposure mask is needed as to-be-measured portions, and verify the specifications of the mask critical dimension across the exposure mask by the critical dimension of a portion that should really be verified.

As this method need not arrange an L/S pattern for measurement at the kerf portion, it can monitor the critical dimension within the exposure area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a diagram for explaining MEF;

FIG. 4 is a distribution diagram showing the distribution of MEFs obtained on a CAD layout according to the first embodiment of this invention;

DETAILED DESCRIPTION OF THE INVENTION

Preferred embodiments of this invention will now be described with reference to the accompanying drawings.

First Embodiment

Figure 1:
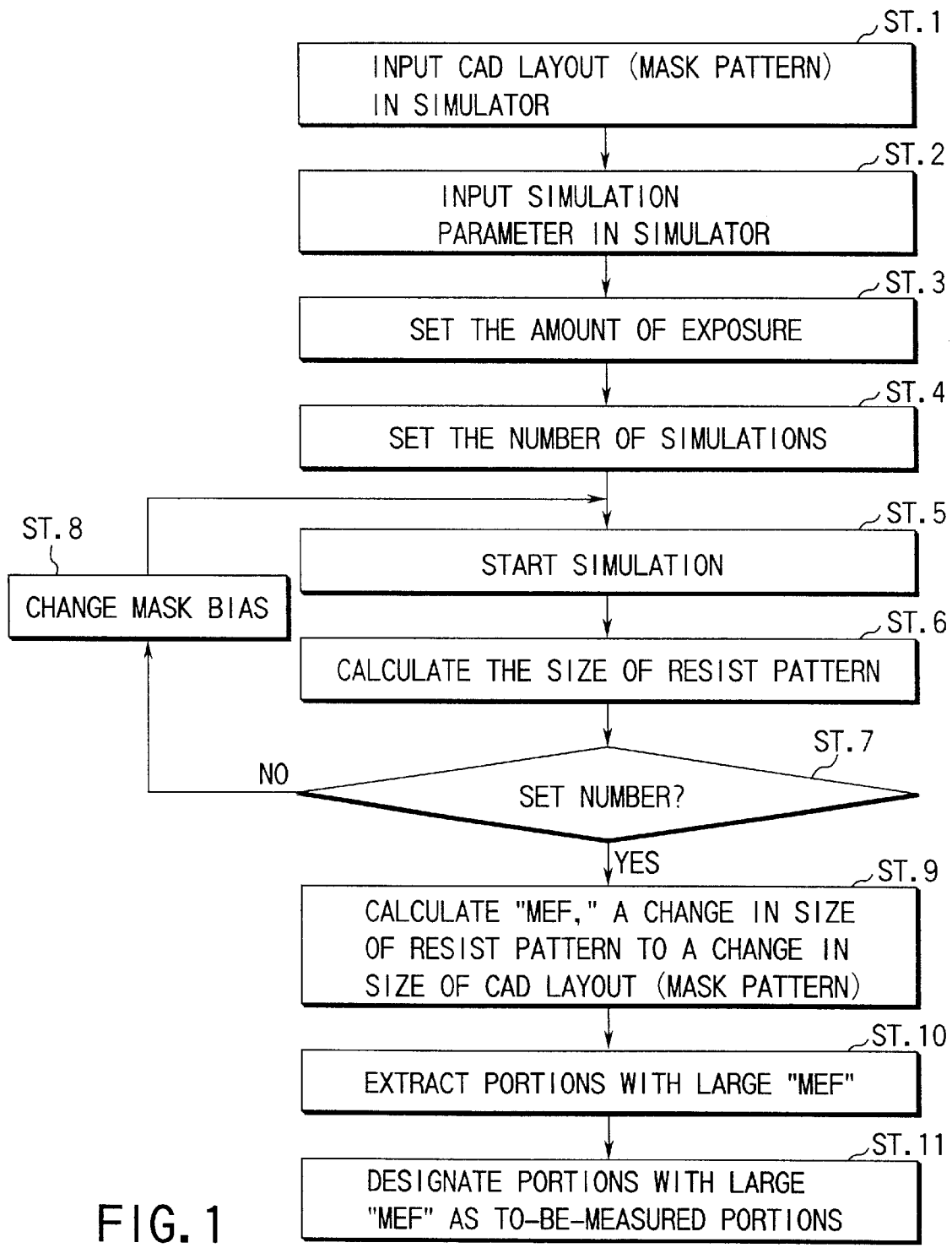
FIG. 1 is a flowchart illustrating an exposure mask inspecting method according to a first embodiment of this invention.

FIG. 1 presents a flowchart illustrating an exposure mask inspecting method according to a first embodiment of this invention.

Figure 2A:
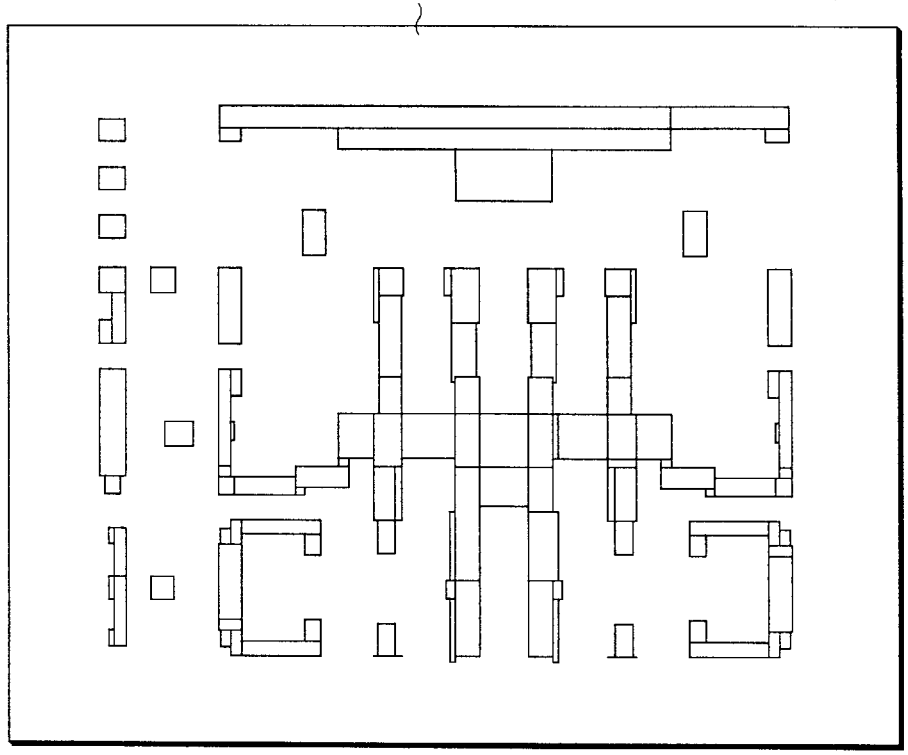
FIG. 2A is a diagram showing an input CAD layout.

First, as shown in FIG. 1, the CAD layout (mask pattern) of an exposure mask which is to be subjected to mask inspection is input to a simulator in step ST 1. The input CAD layout is shown in FIG. 2A. The CAD layout in FIG. 2A is a part of device isolation patterns of a logic device which is formed by the design rule of 0.18 $\mu$m.

As shown in FIG. 2A, the device isolation patterns of a logic device have few repetitive patterns like L/S patterns and are mostly arranged at random.

In the next step ST 2, simulation parameters are input to the simulator. The simulation parameters include at least the optical condition of an exposure system and resist process conditions, and simulate the actual lithography process in the simulator. The optical conditions may include the exposure wavelength, the number of lens apertures (NA) and a coherent factor ($\sigma$), and the resist process conditions may include the film thickness and optical constants (n, k) of the resist and the developing speed.

In the subsequent step ST 3, the amount of exposure is set. In the first embodiment, the amount of exposure is so set as to permit independent line patterns of the desired size of 0.18 $\mu$m on the resist under the conditions that the mask bias is "0" (a conversion difference between the mask CD (critical dimension) and the design CD is zero).

Next, the number of optical simulations is set in step ST 4. In this invention, the optical simulation is performed several times, which will be specifically discussed later.

In the next step ST 5, the optical simulation is initiated with the given simulation parameters and the given amount of exposure. At this time, the mask bias is "0".

Figure 2B:
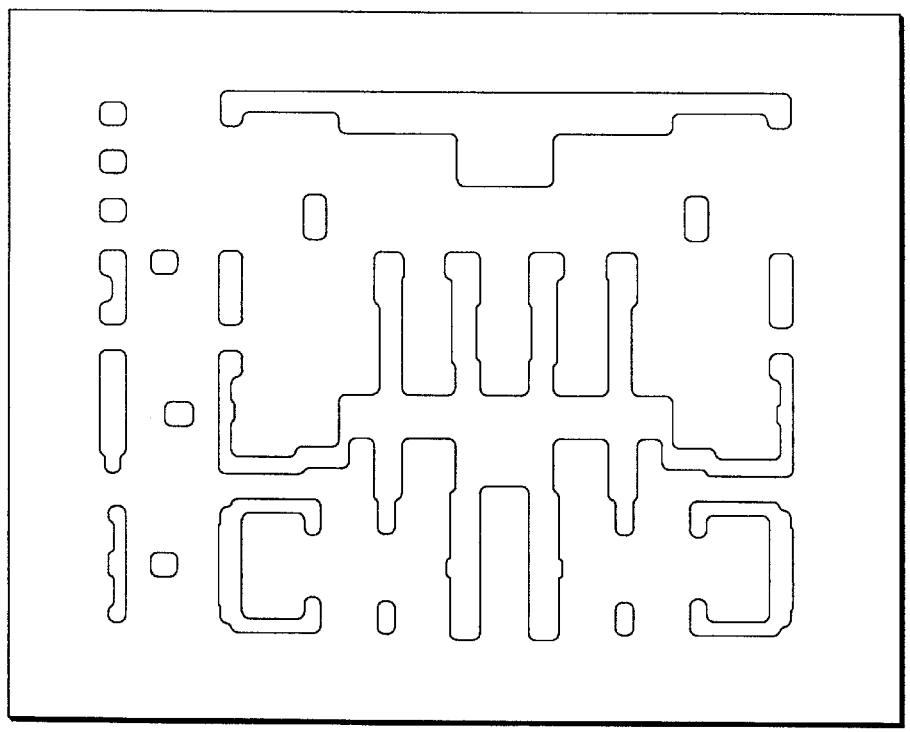
FIG. 2B is a diagram showing the profile of a resist pattern, obtained by simulation.

Subsequently, the size of the resist pattern with the mask bias of "0" is calculated in step ST 6. FIG. 2B shows an optical image acquired by plotting the contours obtained through an optical simulation of the CAD layout shown in FIG. 2A with the mask bias of "0".

In this invention, the above optical simulation is carried out several times while changing the mask bias. Changing the mask bias is equivalent to altering the mask pattern CD of a CAD layout or an exposure mask. According to the first embodiment, the optical simulation is executed three times while changing the mask bias. That is, the number of optical simulations set in step ST 4 is "3." The CD of the resist pattern is calculated in each of the three optical simulations.

Step ST 7 determines if the number of optical simulations has reached the set number. In the first embodiment, it is determined if three optical simulations have been completed. If they are not completed (NO), the mask bias is changed in step ST 8. The mask bias is changed uniformly on the CAD layout, so that the pattern pitch of the CAD layout does not vary significantly only at a specific portion. The expected amount of alteration of the mask bias is about 5% to 10% of the design rule. In the first embodiment, the mask bias was changed to "+20 nm" from "0."

After changing the mask bias, the flow returns to step ST 5 and the optical simulation is started again with the mask bias of "+20 nm." At this time, the simulation parameters and the amount of exposure are not changed.

Then, the size of the resist pattern with the mask bias of "+20 nm" is calculated in step ST 6. That is, an optical image equivalent to the one shown in FIG. 2B is obtained with the mask bias of "+20 nm."

In the subsequent step ST 7, it is determined if a predetermined number of optical simulations have been completed. If the decision is negative (NO), the mask bias is changed to "−20 nm" from "+20 nm" in step ST 8.

Thereafter, the optical simulation with the mask bias of "−20 nm" is performed in step ST 5, and the CD of the resist pattern with the mask bias of "−20 nm" is calculated in step ST 6. The simulation parameters and the amount of exposure are not changed this time too.

The above procedures provide the CDs of the resist pattern with the mask bias of "0," the mask bias of "+20 nm" and the mask bias of "−20 nm."

If it is determined in step ST 7 that the predetermined number of optical simulations have been completed (YES), the flow goes to a step of extracting optimal portions of the exposure mask to be measured.

To extract optical portions for measurement, "MEF" (Mask CD deviation Enhancement Factor) is used in this invention. "MEF" is a factor which quantizes the influence of a variation in the pattern CD of an exposure mask on the CD of the pattern formed on a wafer. "MEF" is disclosed in the document "Electrical Characterization of Across-field Lithographic Performance for 256 M bit DRAM Technologies," Proc. SPIE in Symposium Photomask and X-Ray Mask Technology II, Hideo Yoshikawa, Editor, Vol. 2512, pp. 218–225, 1995 (J. Iba, K. Hashimoto, R. Ferguson, T. Yanagisawa and D. Samuels).

FIG. 3 is a diagram for explaining "MEF."

As shown in FIG. 3, "MEF" is defined as a slope ($\Delta Lr/\Delta Lm$) of a variation in the resist CD ($\Delta Lr$) to a variation in the CD of the exposure mask ($\Delta Lm$) with a constant pattern pitch. The MEF depends on the exposure conditions, design CD, pattern layout, resist conditions and so forth.

As apparent from FIG. 3, a variation in the CD of the exposure mask multiplied by an "MEF" becomes a variation in the resist CD. That is, when MEF<1, a variation in the resist CD has been enhanced more than a variation in the CD of the exposure mask. Using this "MEF," one can know that portion in the pattern of an exposure mask whose CD variation will enhance a variation in the resist CD. That is, it is possible to specify that portion at which a variation in the pattern CD of the exposure mask should be controlled more precisely.

Using the above fact, an "MEF" for every pattern of the CAD layout is calculated in step ST 9 in the first embodiment.

In step ST 9, calculation is carried out with an "MEF" being defined as a line width of the resist pattern ($\Delta$CDresist)/a line width of a CAD layout pattern ($\Delta$CDmask).

FIG. 4 shows the distribution of "MEFs" computed in step ST 9 on the CAD layout.

As shown in FIG. 4, "MEFs" do not appear evenly on the CAD layout but appear as various values. The portion that has a large "MEF" is where a variation in the CD of the CAD layout pattern enhances a variation in the CD of the resist pattern. That is, at such a portion, a variation in the pattern CD of the exposure mask should be controlled more precisely.

In the next step ST 10, portions with relatively large "MEFs" are extracted from the CAD layout patterns. In the first embodiment, a reference value for determining if "MEF" is large or small is set to 1.5. As shown in FIG. 4, portions A and B whose "MEFs" are equal to or greater than 1.5 are extracted as portions with large "MEFs."

Next, the extracted portions A and B are designated as to-be-measured portions for measuring the CD of the exposure mask in step ST 11.

The exposure mask inspecting method according to the first embodiment
(1) calculates "MEFs" of the CAD layout patterns,
(2) extracts portions with large "MEFs" from the CAD layout patterns, and
(3) designates the extracted portions as to-be-measured portions for measuring the CD of the exposure mask.

The exposure mask inspecting method with the above-described design can designate, as to-be-measured portions, those portions at which the CD of the exposure mask should be controlled more precisely. It is thus possible to verify the specifications of the mask CD across the exposure mask by the CD of a portion that should really be verified.

What is more, to-be-measured portions designated by this invention are selected from the exposure area. Therefore, the specifications of the mask CD across the exposure mask can be verified by measuring a pattern in the exposure area that actually functions as a device. The precision of verification of the specifications of the mask CD across the exposure mask can be made higher than that in a case of measuring the CD of a to-be-measured pattern formed at the kerf portion which does not function as a device.

Second Embodiment

In the first embodiment, to determine whether an "MEF" is large or small, a certain reference value (specifically "1.5") is set and an "MEF" is compared with the reference value. The system of determining whether an "MEF" is large or small is not limited to the comparison with a set reference value, but may be changed to a different system.

The second embodiment relates to another system of determining whether an "MEF" is large or small.

Figure 5:
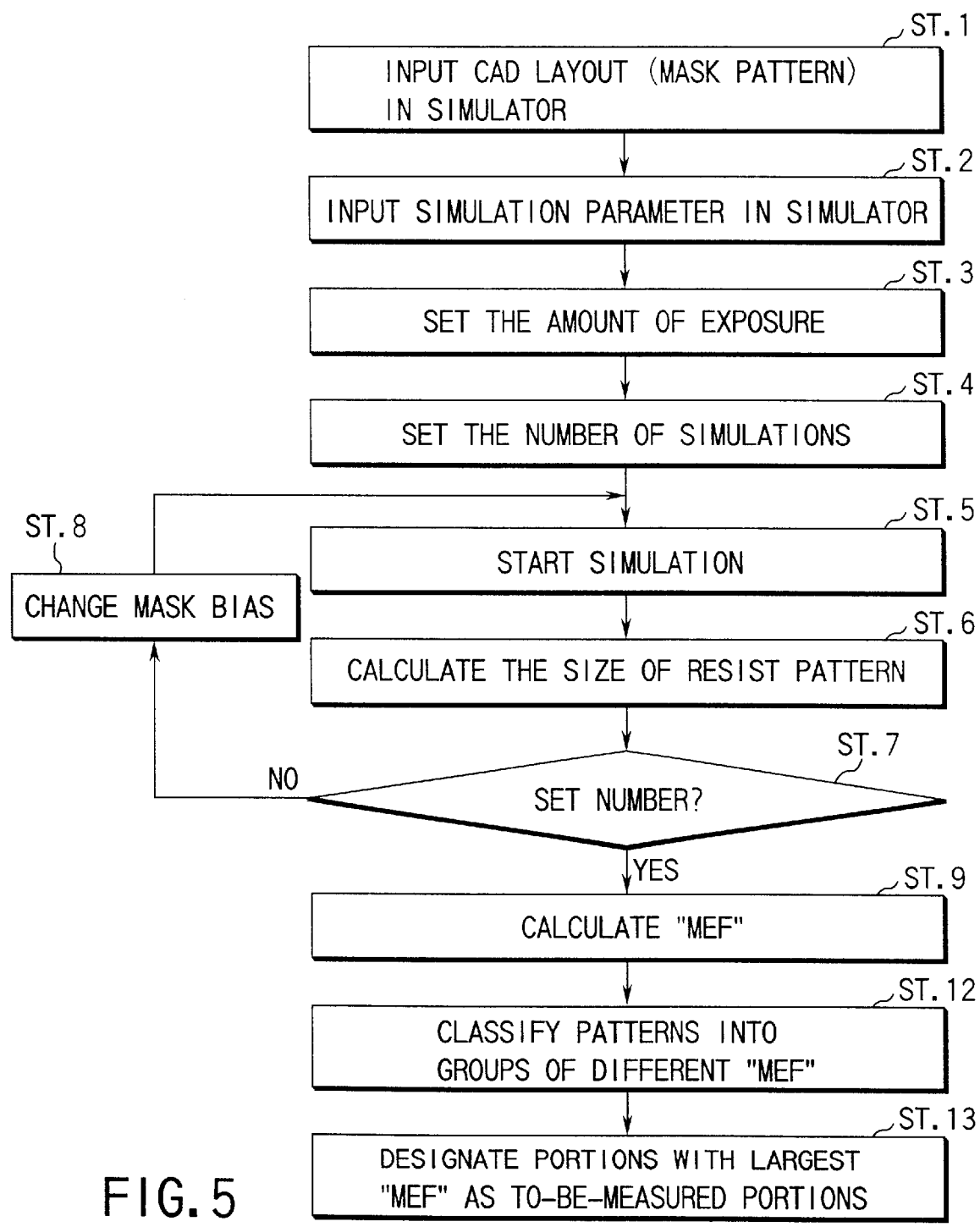
FIG. 5 is a flowchart illustrating an exposure mask inspecting method according to a second embodiment of this invention.
Figure 6:
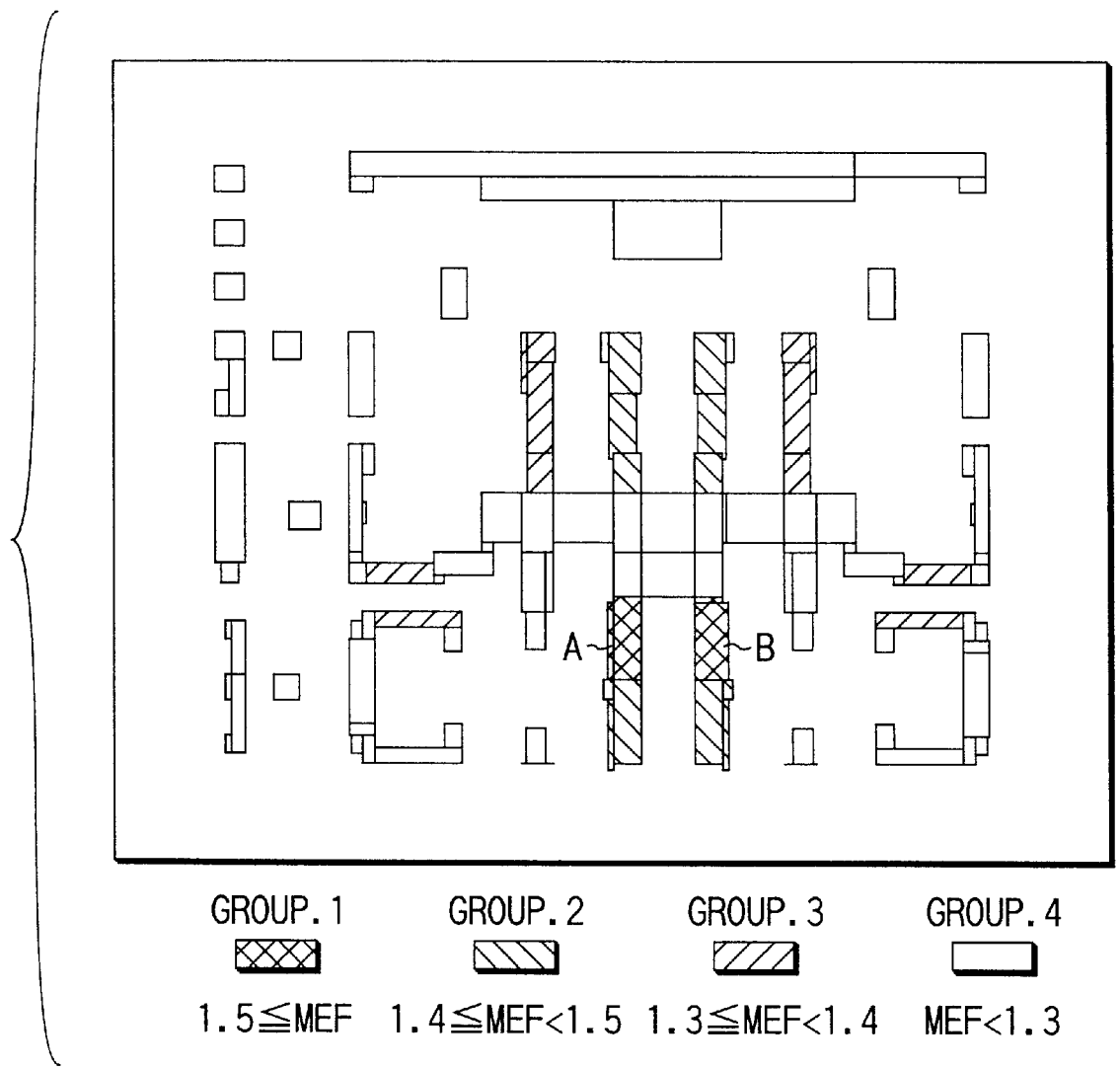
FIG. 6 is a distribution diagram showing the distribution of MEFs obtained on a CAD layout according to the second embodiment of this invention.

FIG. 5 is a flowchart illustrating an exposure mask inspecting method according to the second embodiment of this invention, and FIG. 6 is a diagram showing the distribution of "MEFs" obtained on a CAD layout.

As apparent from FIG. 5, "MEFs" of the CAD layout patterns are calculated through steps ST 1 to ST 9 which have already been discussed in the section of the first embodiment.

Next, the patterns are classified into groups of different "MEFs" in step ST 12. In the second embodiment, the circuit patterns are classified into several groups according to the values of "MEFs." Specifically, the circuit patterns are classified into the following four groups as shown in FIG. 6.

GROUP 1: $1.5 \leq$ MEF
GROUP 2: $1.4 \leq$ MEF$<1.5$
GROUP 3: $1.3 \leq$ MEF$<1.4$
GROUP 4: MEF$<1.3$ Of the four groups, the one with the largest "MEF" is designated as to-be-measured portions in step ST 13. That is, GROUP 1 is designated as to-be-measured portions. In FIG. 6, the portions A and B included in GROUP 1 are designated as to-be-measured portions.

According to the second embodiment, the method
(1) calculates "MEFs" of the CAD layout patterns,
(2) classifies the CAD layout patterns into groups of different "MEFs," and
(3) designates the group with the largest "MEF" as to-be-measured portions for measuring the CD of the exposure mask.

The second embodiment, like the first embodiment, can designate, as to-be-measured portions, those portions at which the CD of the exposure mask should be controlled more precisely. The second embodiment can thus have the same advantages as the first embodiment.

According to the second embodiment, the CAD layout patterns are classified into groups of different "MEFs" and designates the group with the largest "MEF" as to-be-measured portions. This makes it unnecessary to set a reference value for determining whether an "MEF" is large or small.

Therefore, the second embodiment is particularly effective in inspecting such an exposure mask that makes it difficult to predict "MEFs" and set a reference value for determining whether an "MEF" is large or small.

Third Embodiment

The exposure masks used in the first and second embodiments are for forming a device isolation pattern.

This invention is not however limited to an exposure mask for forming a device isolation pattern but can be adapted to any kind of exposure mask which is used in fabricating semiconductor integrated circuit devices. Exposure masks available in fabricating semiconductor integrated circuit devices include an exposure mask for forming a gate pattern, an exposure mask for forming an interconnection pattern, an exposure mask for forming a pattern of contact holes, through holes or via holes, and an exposure mask for a window pattern through which impurity ions are implanted.

Figure 7:
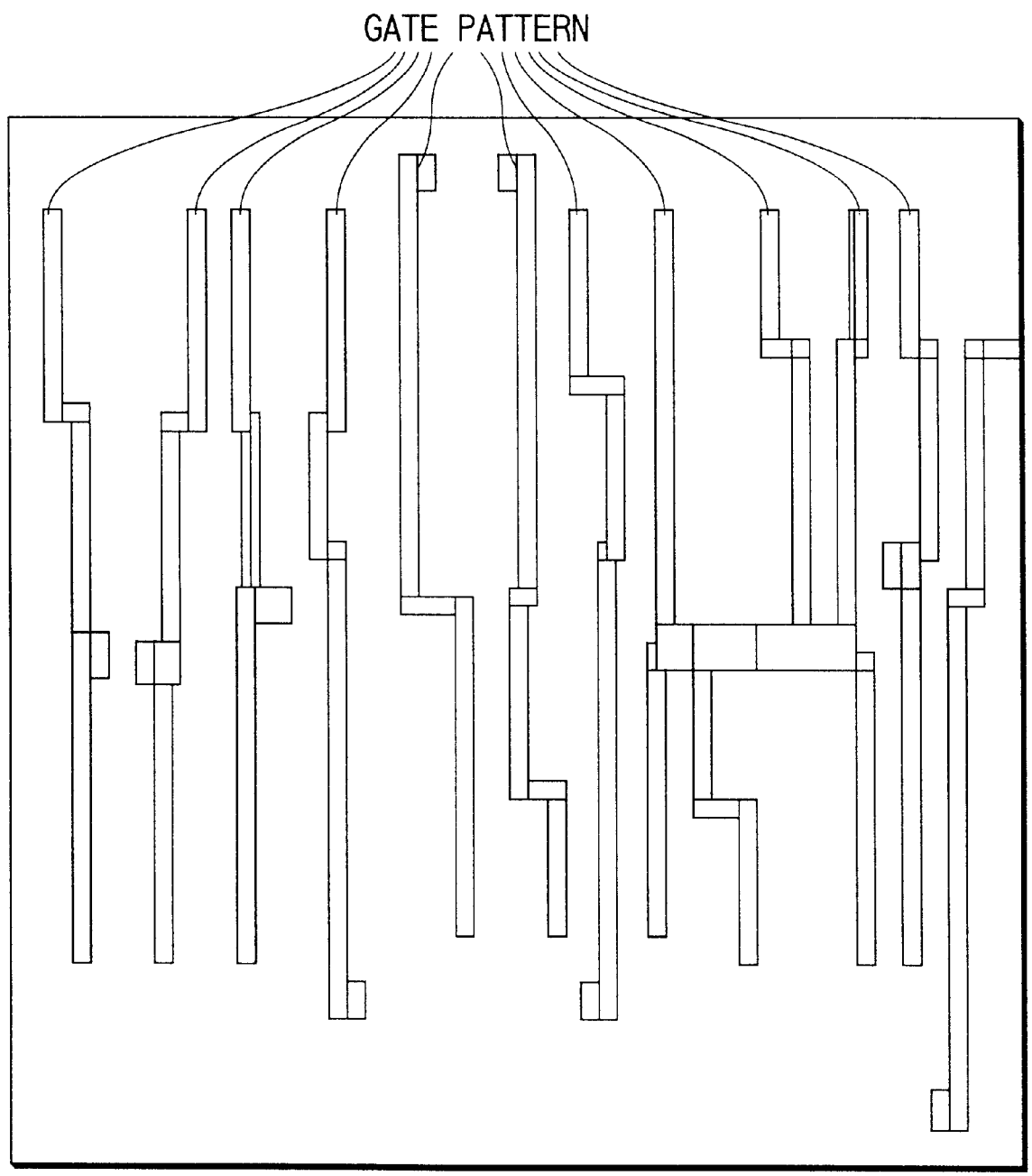
FIG. 7 is a diagram showing an input CAD layout according to a third embodiment of this invention.
Figure 8:
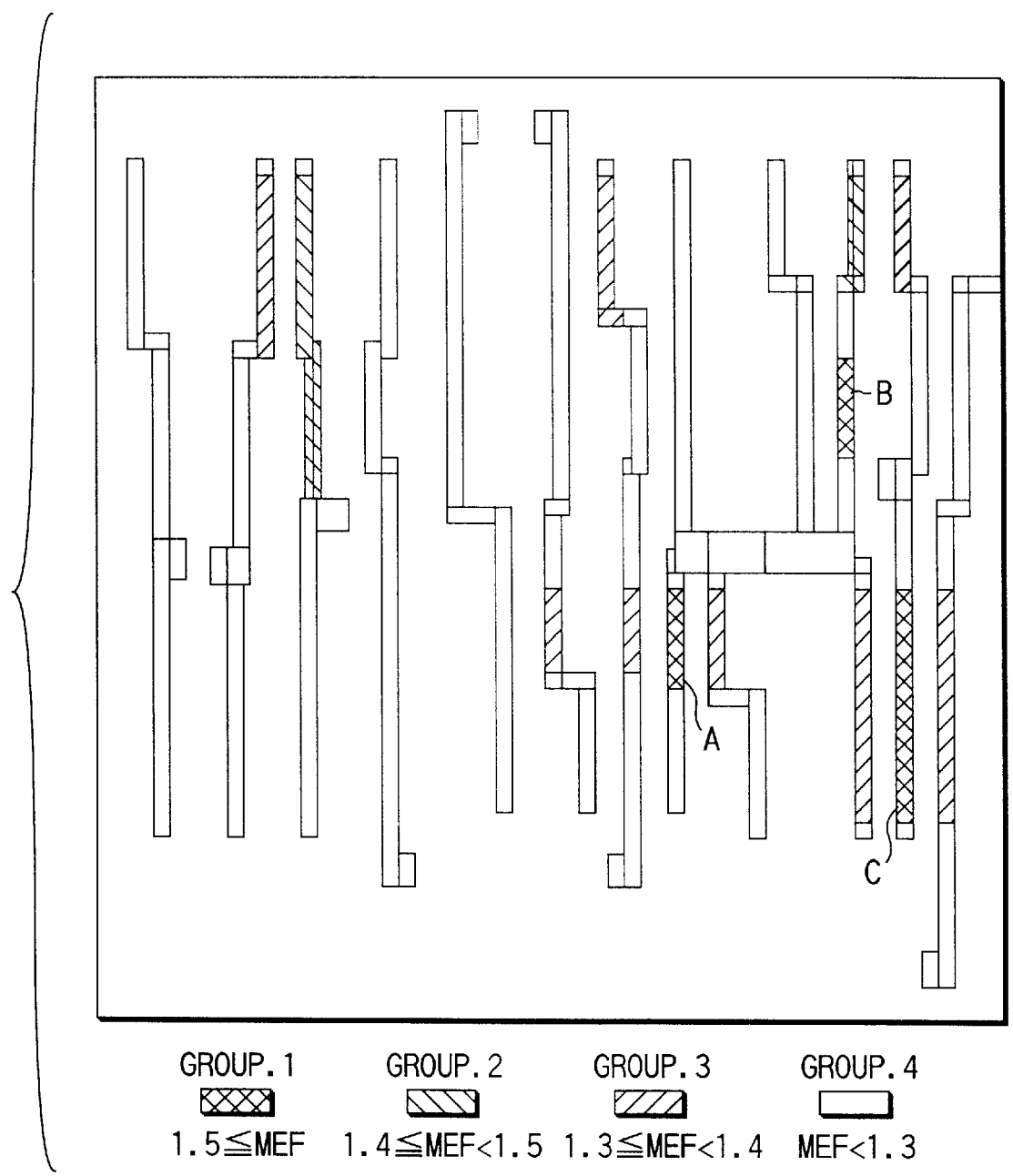
FIG. 8 is a distribution diagram showing the distribution of MEFS obtained on a CAD layout according to the third embodiment of this invention.

FIG. 7 is a diagram showing the input CAD layout of an exposure mask for forming a gate pattern, and FIG. 8 is a diagram showing the distribution of MEFs that have been obtained on the CAD layout in FIG. 7 by the above-described method of second embodiment.

As shown in FIG. 8, portions A, B and C included in GROUP 1 are designated as to-be-measured portions.

As apparent from the diagram, the exposure-mask inspecting method according to this invention can be adapted to any kind of exposure mask which is used in fabricating semiconductor integrated circuit devices.

Fourth Embodiment

Although calculation of "MEFs" is performed for all the patterns of the CAD layout in the first to third embodiments, this calculation can be performed only for a specific pattern of the CAD layout.

Figure 9:
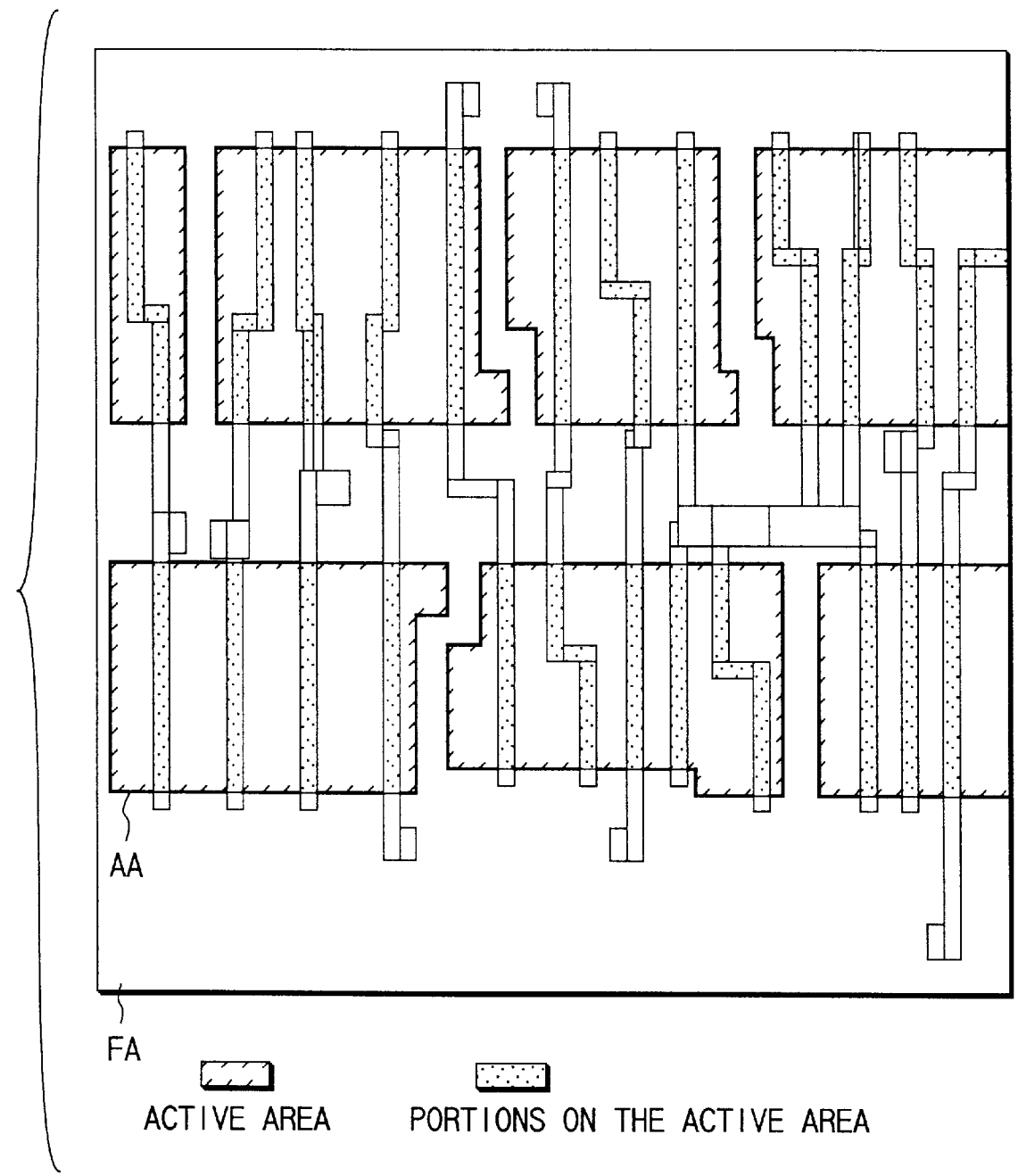
FIG. 9 is a diagram showing a relationship between a gate pattern and a base pattern.

As shown in FIG. 9, a gate pattern is separated into a portion on a device isolation area pattern (Field Area: hereinafter referred to as "FA") and a portion on a device area pattern (Active Area: hereinafter referred to as "AA"). Of the gate pattern, the portion that lies over the "FA" serves as interconnection, and the portion that lies over the "AA" serves as the gate of a transistor. For the latter portion over the "AA" that serves as the gate of a transistor precise, very strict CD control should be carried out, because the line width of the gate pattern directly affects the transistor characteristics.

In the fourth embodiment, therefore, the portion of the gate pattern that lies over the "AA" is specified as a pattern whose "MEF" is to be calculated, and the "MEF" of the specified pattern is calculated.

Figure 10:
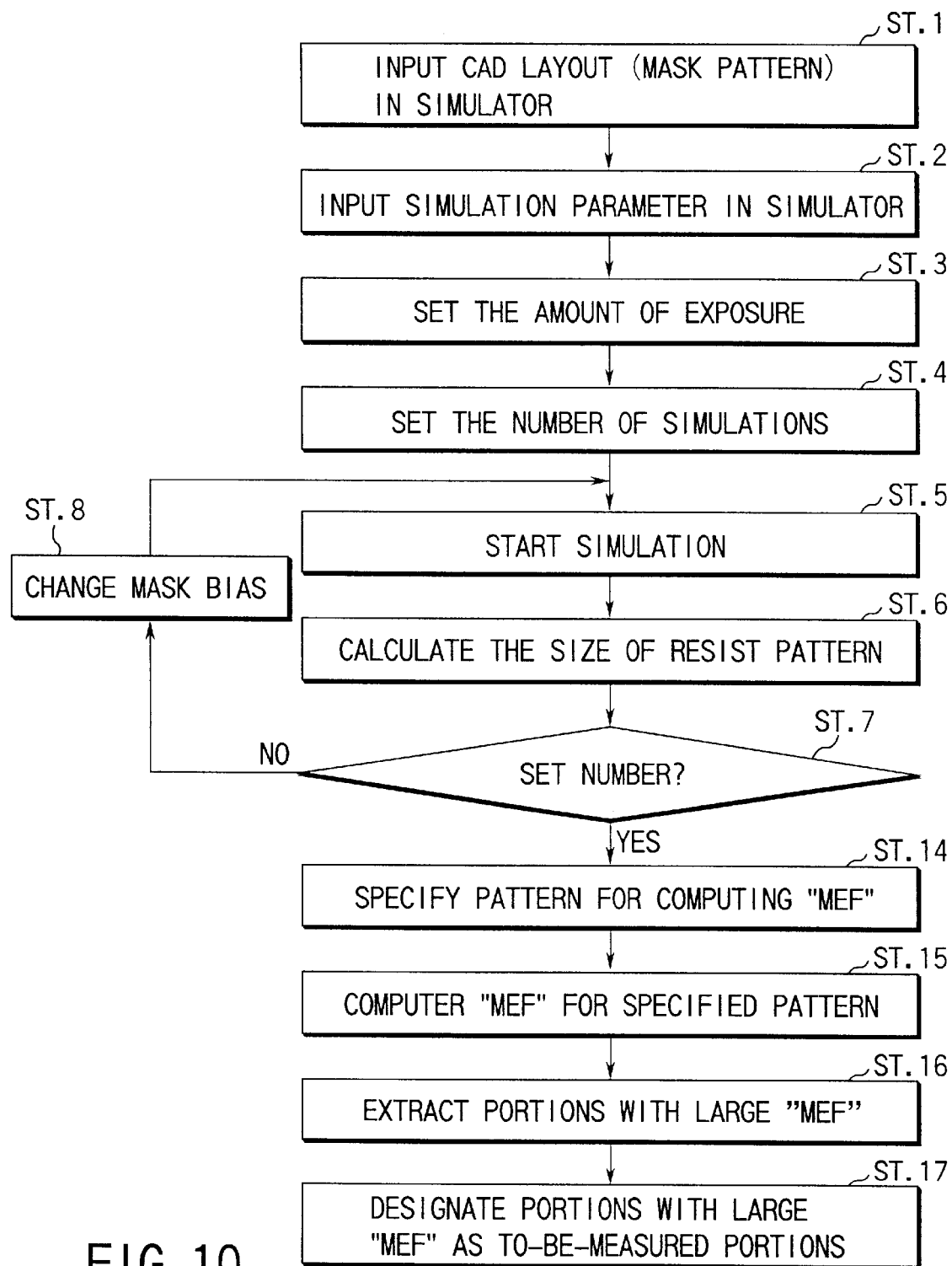
FIG. 10 is a flowchart illustrating an exposure mask inspecting method according to a fourth embodiment of this invention.
Figure 11:
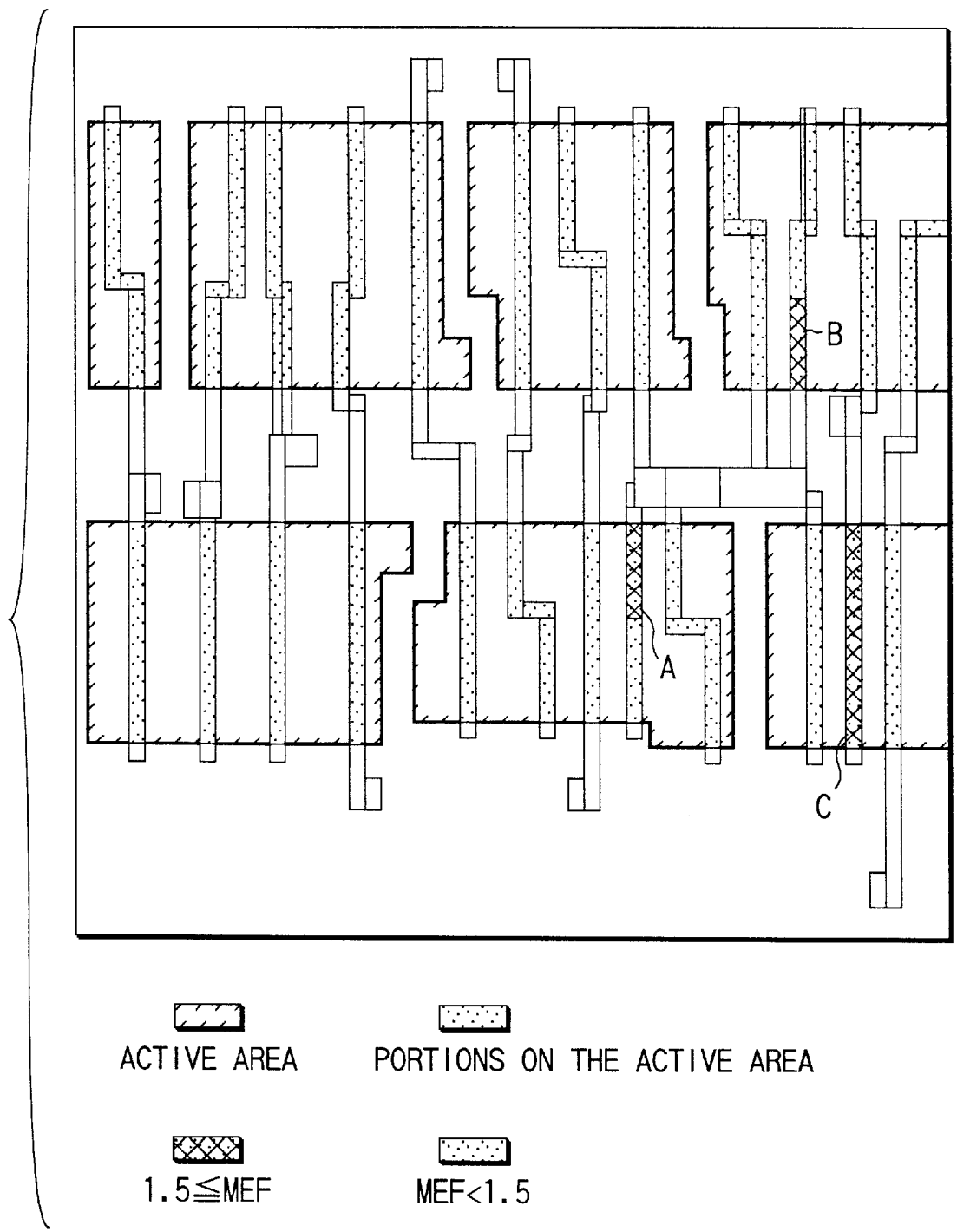
FIG. 11 is a distribution diagram showing the distribution of MEFs obtained on a CAD layout according to the fourth embodiment of this invention.

FIG. 10 is a flowchart illustrating an exposure mask inspecting method according to the fourth embodiment of this invention, and FIG. 11 is a diagram showing the distribution of obtained MEFs on a CAD layout.

As shown in FIG. 10, an optical simulation is executed through steps ST 1 to ST 8 which have already been discussed in the section of the first embodiment.

Next, a pattern whose "MEFs" are to be calculated is specified in step ST 14. Specifically, as shown in FIG. 9, the portion of the gate pattern that lies over the "AA" pattern is specified as a pattern whose "MEFs" are to be calculated.

In the next step ST 15, the "MEFs" of the specified pattern is calculated. Next, those portions of the specified pattern whose "MEFs" are relatively large are extracted. In the fourth embodiment, a reference value for determining whether an "MEF" is large or small is set to 1.5 as per the first embodiment. As shown in FIG. 11, the portions A, B and C whose "MEFs" are equal to or greater than 1.5 are extracted as portions with large "MEFs."

Then, the extracted portions A and B are designated as to-be-measured portions for measuring the CD of the exposure mask in step ST 17.

The exposure mask inspecting method according to the fourth embodiment (1) specifies a pattern whose "MEFs" are to be computed, from the patterns of the CAD layout, (2) calculates "MEFs" of the specified pattern, (3) extracts portions with large "MEFs" from the specified pattern, and (4) designates the extracted portions with large "MEFs" as to-be-measured portions for measuring the CD of the exposure mask.

This fourth embodiment, like the first embodiment, can designate, as to-be-measured portions, those portions at which the CD of the exposure mask should be controlled precisely. The fourth embodiment can therefore have the same advantages as the first embodiment.

The fourth embodiment can reduce the number of portions whose "MEFs" are to be calculated, as compared with the first embodiment, and can thus shorten the time for computing "MEFs." Although the fourth embodiment selects to-be-measured portions by the above-described method of the first embodiment, selection may be made using the above-described method of the second embodiment.

Fifth Embodiment

Figure 12A:
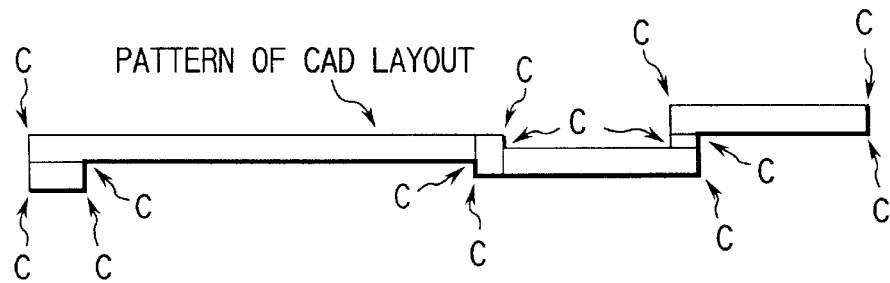
FIG. 12A is a diagram showing the CAD layout of an exposure mask.
Figure 12B:
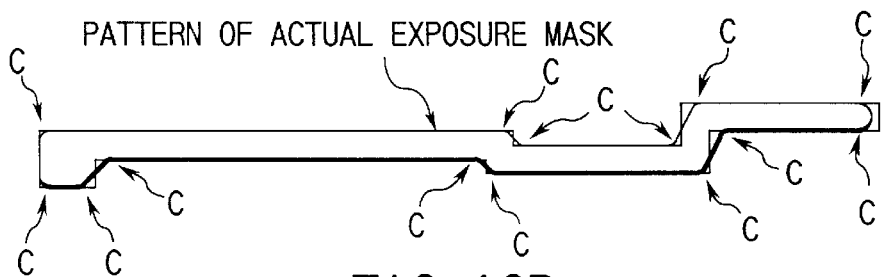
FIG. 12B is a diagram depicting an actual exposure mask.

FIG. 12A is a diagram showing the CAD layout of an exposure mask, and FIG. 12B is a diagram depicting an actual exposure mask.

As shown in FIG. 12A, corners "C" of the CAD layout are drawn has having right angles.

For an actual exposure mask, however, corners "C" do not form right angles as shown in FIG. 12B. This is because the pattern of an actual exposure mask is formed by using lithography technology as done in fabricating a semiconductor integrated circuit device.

Figure 12C:
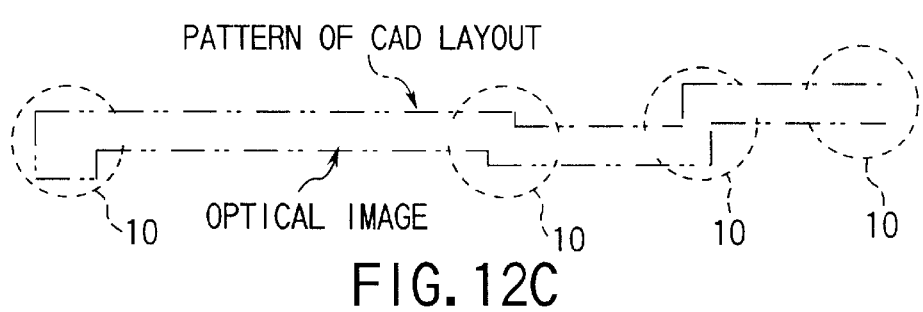
FIG. 12C is a diagram showing a relationship between the CAD layout and an optical image.

Since execution of an optical simulation using the CAD layout shown in FIG. 12A causes light diffraction, interference or the like at the corners "C," the optical image is deviated significantly from the CAD layout. It is therefore considered that an MEF is large particularly in areas 10 that include the corners "C," as shown in FIG. 12C, so that many areas 10 may be selected as to-be-measured portions.

The fifth embodiment is designed to deal with this situation.

Figure 13A:
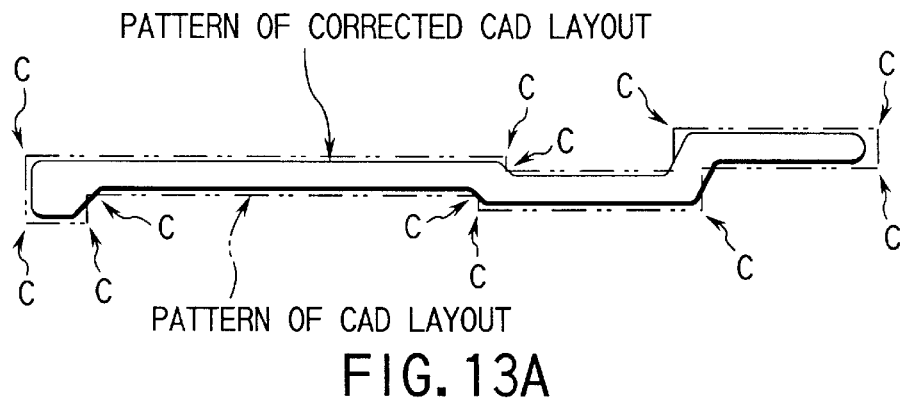
FIG. 13A is a diagram showing the CAD layout of an exposure mask according to a fifth embodiment of this invention.

FIG. 13A is a diagram showing the CAD layout according to the fifth embodiment of this invention.

As shown in FIG. 13A, the corners "C" of the CAD layout are so corrected as to match with the pattern of the actual exposure mask in the fifth embodiment.

Figure 13B:
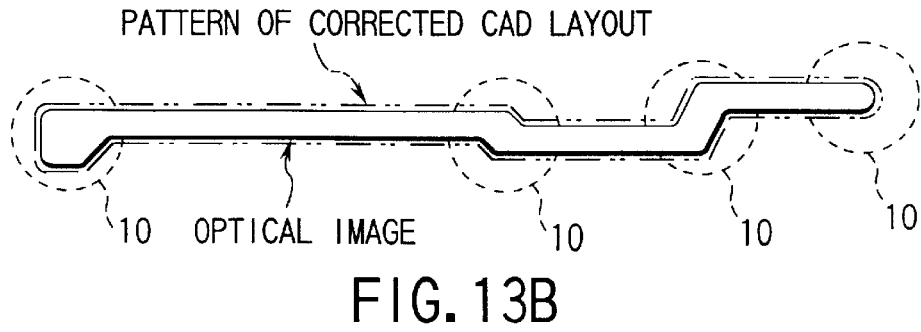
FIG. 13B is a diagram showing a relationship between the CAD layout and an optical image according to the fifth embodiment of this invention.

By correcting the corners "C" of the CAD layout in such a way as to match with the pattern of the actual exposure mask, as shown in FIG. 13B, an optical image obtained through simulation will not be deviated considerably from the CAD layout particularly in the area 10 containing the corner "C." It is thus possible to deal with the situation where many areas 10 are selected as to-be-measured portions.

Sixth Embodiment

In the first to fifth embodiments, the number of to-be-measured portions is not specified. Not specifying the number of to-be-measured portions is effective for exposure masks for products in the developing phase and the state-of-the-art devices in the research phase. This is because exposure masks for producing those products and devices demand a very high CD precision. The size precision of exposure masks becomes higher as the number of to-be-measured portions increases.

In contrast to exposure masks for products in the developing phase and the state-of-the-art devices in the research phase, exposure masks which are used for products in the mass-production stage require high throughput as well as high CD precision. Exposure masks are consumable goods and need to be kept supplied to a mass-production factory. Increasing the number of to-be-measured portions unnecessarily requires a longer inspection time, thus lowering the throughput.

It is thus effective to specify the proper number of to-be-measured portions particularly for exposure masks to be used for mass-produced products.

The six embodiment is for a case of specifying the number of to-be-measured portions.

Figure 14:
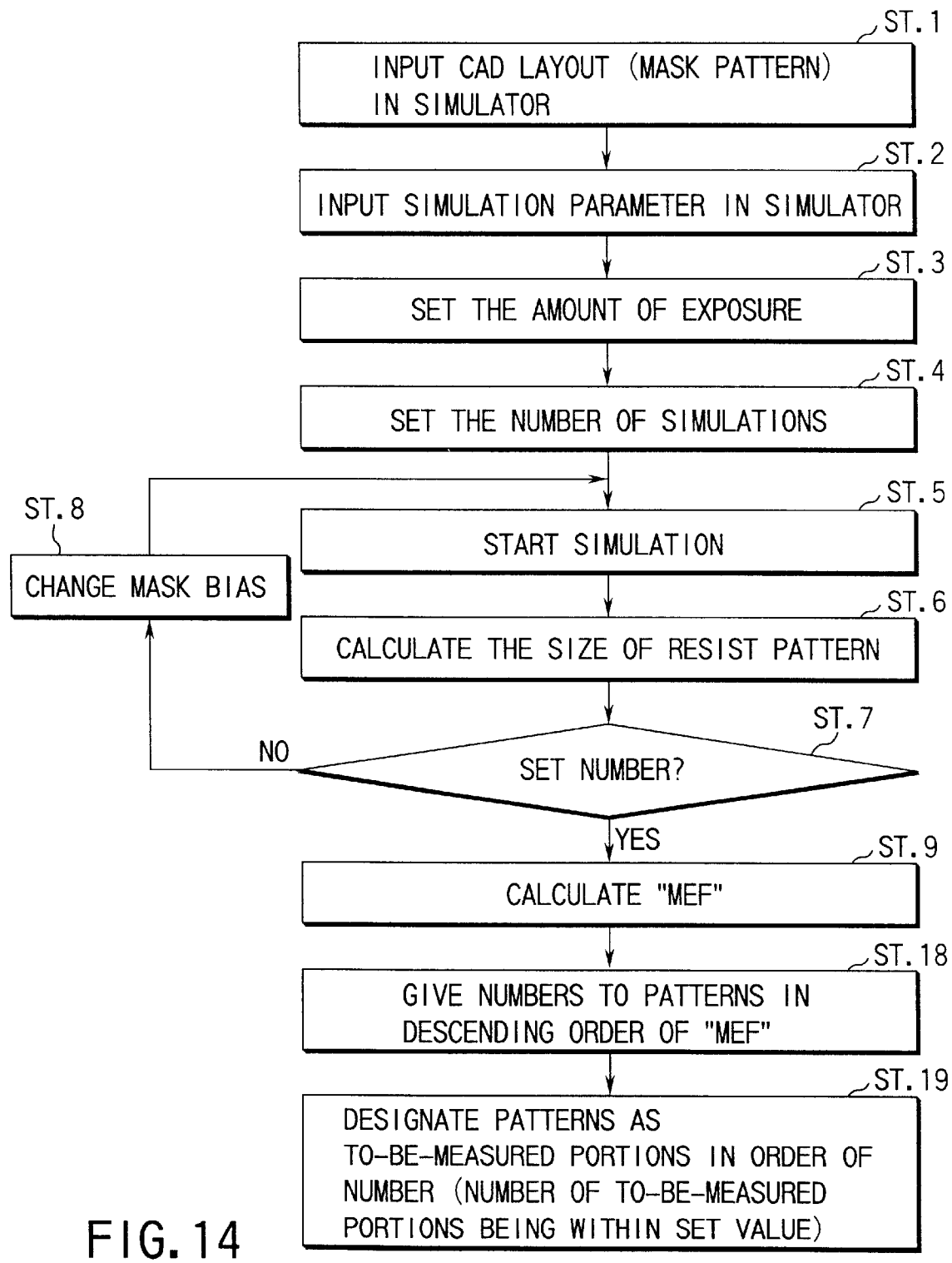
FIG. 14 is a flowchart illustrating an exposure mask inspecting method according to a sixth embodiment of this invention.

FIG. 14 is a flowchart illustrating an exposure mask inspecting method according to the sixth embodiment of this invention.

As shown in FIG. 14, "MEFs" of the CAD layout patterns are calculated through steps ST 1 to ST 9 which have already been discussed in the section of the first embodiment.

In the next step ST 18, pattern numbers are given in descending order of the value of "MEF."

Then, the patterns are designated as to-be-measured portions in order of the given number within the set number of to-be-measured portions in step ST 19. In the sixth embodiment, the number of to-be-measured portions is set to "20."

Like the first embodiment, this sixth embodiment can designate those portions at which the size of the exposure mask should be controlled precisely as to-be-measured portions. The sixth embodiment can therefore have the same advantages as the first embodiment.

In the sixth embodiment, the patterns are designated as to-be-measured portions in order of the value of "MEF." Even when the number of to-be-measured portions is limited, therefore, the sixth embodiment can designate optimal to-be-measured portions within the limited number.

Seventh Embodiment

In the first to sixth embodiments, the positions of to-be-measured portions in the exposure mask surface are not defined. For existing LSIs, transistors of almost the same CDs are located almost uniformly all over the chip and portions with large "MEFs" generally appear almost uniformly in the exposure mask surface.

But, there is a high probability that transistors of various CDs will be integrated on a single chip in the future. In addition to this probability, transistors of a specific CD may be arranged at a local area of a chip. This means designing of a system LSI.

According to a system LSI, logic circuits which are typified by a processor and memory circuits which are typified by a DRAM are integrated on a single chip. For such a system LSI, it is fully expected that portions with large "MEFs" are concentrated in a DRAM block or a processor block. When such a phenomenon occurs, to-be-measured portions are concentrated in a local area of an exposure mask. The local concentration of to-be-measured portions causes CD verification of the exposure mask to be performed only by measuring the CD of the local area. This may impair the uniformity of the verification precision of the exposure mask within its surface.

The seventh embodiment is designed to improve the uniformity of the verification precision of the exposure mask within its surface.

Figure 15:
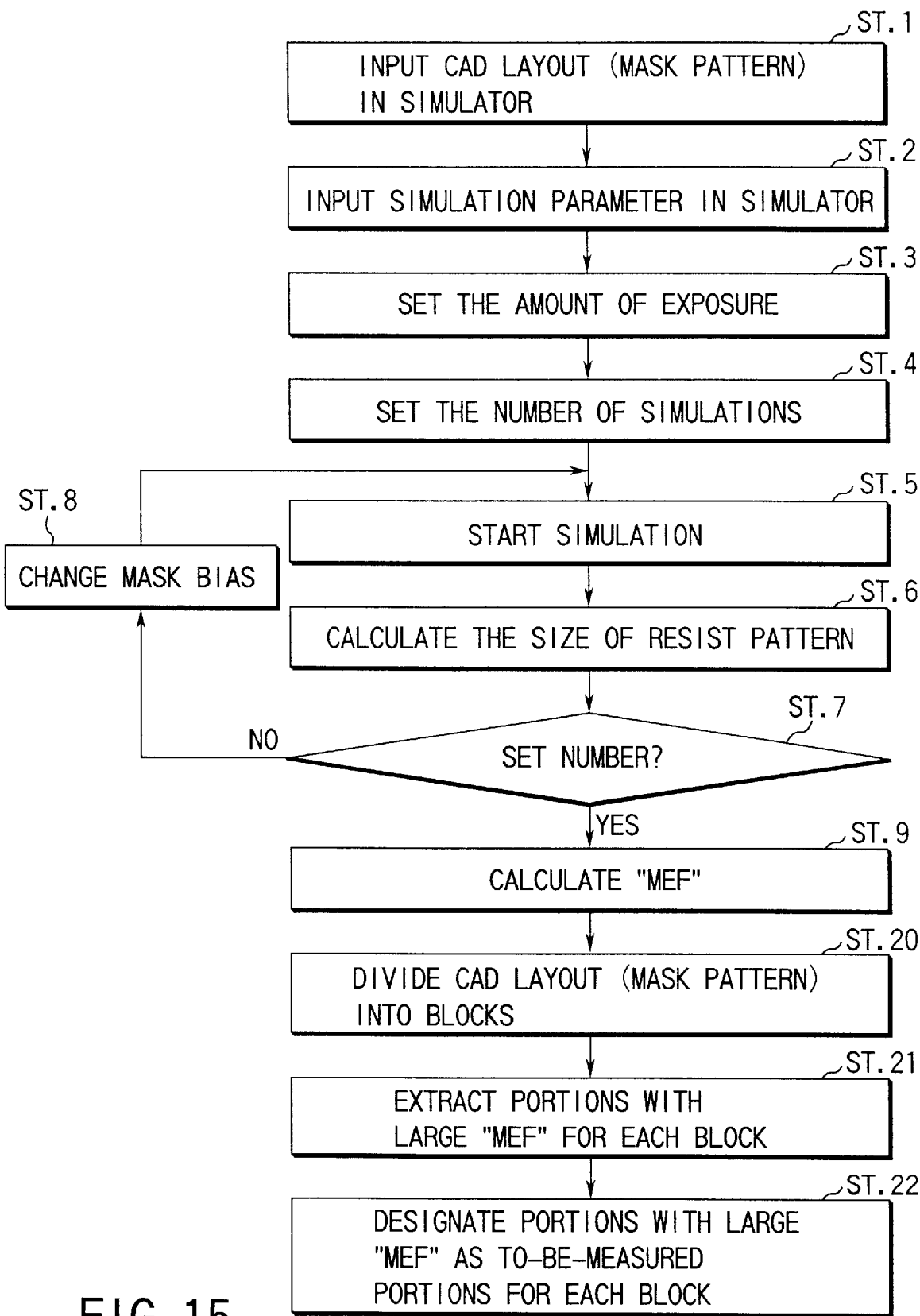
FIG. 15 is a flowchart illustrating an exposure mask inspecting method according to a seventh embodiment of this invention.

FIG. 15 is a flowchart illustrating an exposure mask inspecting method according to the seventh embodiment of this invention.

As shown in FIG. 15, "MEFs" of the CAD layout patterns are calculated through steps ST 1 to ST 9 which have already been discussed in the section of the first embodiment.

In the next step ST 20, the CAD layout is separated into a plurality of planar blocks.

Figure 16:
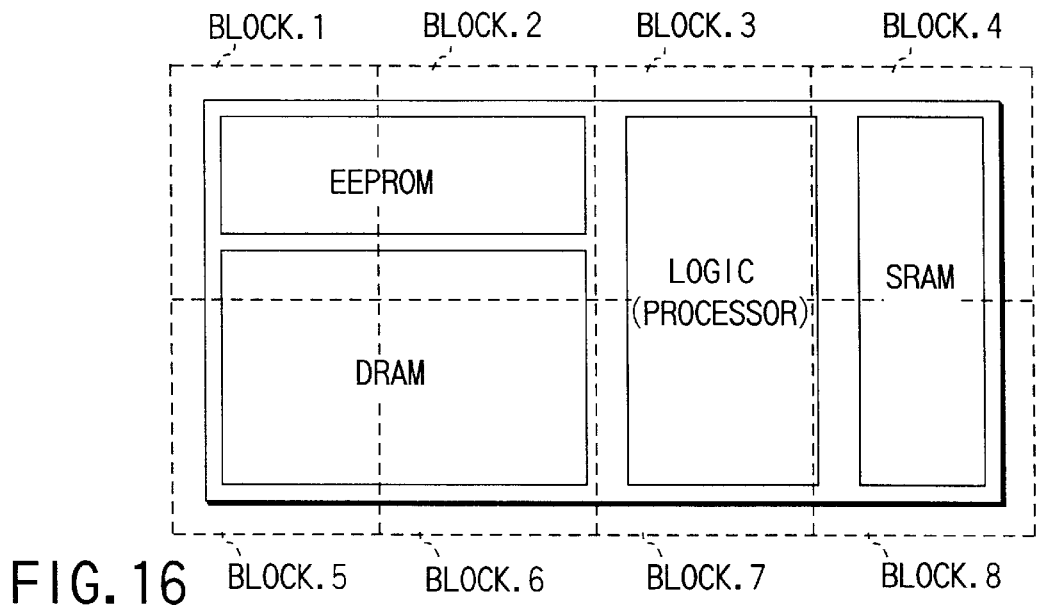
FIG. 16 is a diagram showing block segmentation to be used in a seventh embodiment of this invention.

FIG. 16 is a diagram exemplifying block segmentation.

As shown in FIG. 16, the CAD layout is separated into eight planar blocks (BLOCK 1 to BLOCK 8) in this example.

In the next step ST 21, portions with large "MEFs" are extracted block by block (BLOCK 1 to BLOCK 8).

In the subsequent step ST 22, portions with large "MEFs" are designated as to-be-measured portions block by block (BLOCK 1 to BLOCK 8).

Like the first embodiment, this seventh embodiment can designate those portions at which the CD of the exposure mask should be controlled precisely as to-be-measured portions. The seventh embodiment can therefore have the same advantages as the first embodiment.

As to-be-measured portions are designated block by block (BLOCK 1 to BLOCK 8) in the seventh embodiment, the to-be-measured portions are not concentrated on a local are of the exposure mask.

The seventh embodiment can thus improve the uniformity of the verification precision of the exposure mask within its surface.

It is to be noted that the seventh embodiment can be used in combination with the first to sixth embodiments.

Eighth Embodiment

In the seventh embodiment, a CAD layout is simply separated into eight blocks. But, a CAD layout may be separated into circuit blocks.

Figure 17:
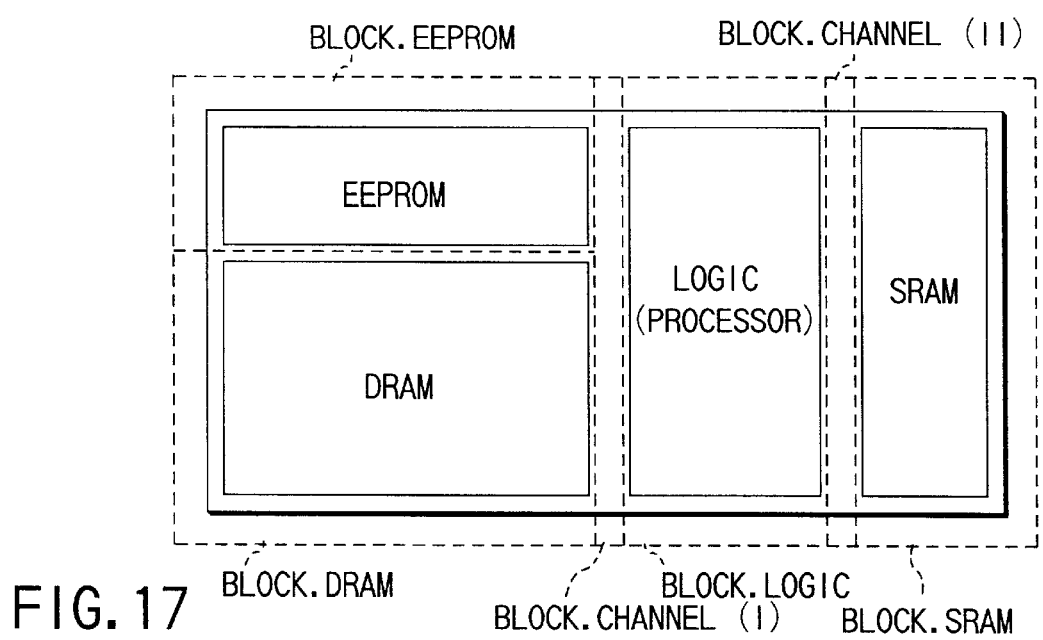
FIG. 17 is a diagram showing block segmentation to be used in an eighth embodiment of this invention.

FIG. 17 is a diagram showing another example of block segmentation according to an eighth embodiment of this invention.

As shown in FIG. 17, a CAD layout is separated into circuit blocks, namely, BLOCK EEPROM, BLOCK DRAM, BLOCK LOGIC and BLOCK SRAM.

Further, interconnection channel blocks (BLOCK CHANNEL(1) and BLOCK CHANNEL(2)) are set in addition to the circuit blocks. Although it is not particularly necessary to set blocks for the interconnection channels, blocks can be set for the interconnection channels as well as for the circuit blocks.

Like the first embodiment, this eighth embodiment can designate those portions at which the CD of the exposure mask should be controlled precisely as to-be-measured portions. The eighth embodiment can thus have the same advantages as the first embodiment.

Since the eighth embodiment, like the seventh embodiment, can deal with local concentration of to-be-measured portions on an exposure mask, it can improve the uniformity of the verification precision of the exposure mask within its surface.

It is to be noted that the eighth embodiment can be used in combination with the first to sixth embodiments.

Ninth Embodiment

Any of the exposure-mask inspecting methods embodying this invention, which has been explained in the foregoing description of the first to eighth embodiments, can be programmed and can be recorded on a recording medium, such as a floppy disk or a compact disk, which is readable by a computer.

Figure 18:
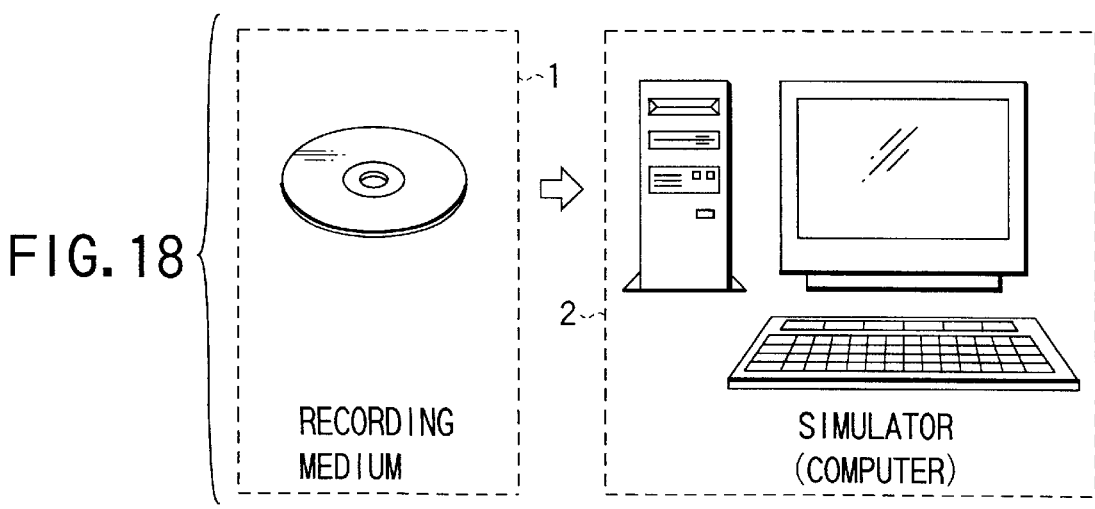
FIG. 18 is a diagram illustrating a recording medium and a simulator which are used in a ninth embodiment of this invention.

As shown in FIG. 18, a recording medium 1 on which the exposure-mask inspecting method embodying this invention is recorded as a program is set in a simulator (computer) 2. The simulator 2 loads the program from the recording medium 1. According to the read program, the simulator 2

(1) executes calculation of "MEFs" of the CAD layout pattern, (2) executes extraction of portions with large "MEFs" from the CAD layout pattern to search for optimal to-be-measured portions for measuring the size of the exposure mask from the CAD layout, and (3) designates the extracted portions with large "MEFs" as candidates for to-be-measured portions for measuring the size of the exposure mask.

One example of the program to be recorded on the recording medium 1 will now be discussed. While this example of the program will be explained referring to the inspecting method according to the first embodiment, it should be noted that any of programs according to the second to eighth embodiments can be recorded as well on the recording medium 1.

Figure 19:
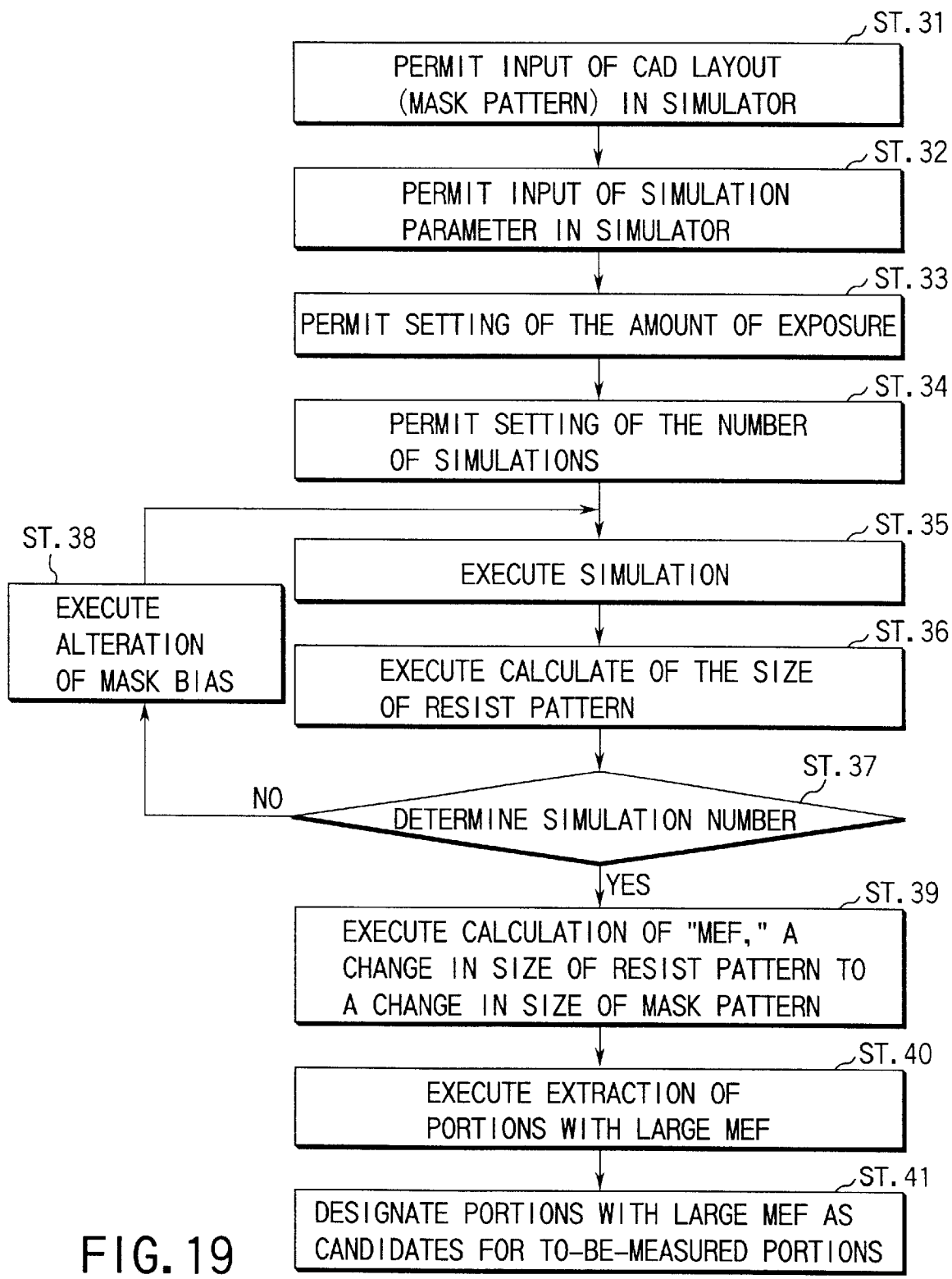
FIG. 19 is a flowchart for a program for searching for to-be-measured portions according to the ninth embodiment of this invention.

FIG. 19 is a flowchart for the program according to the ninth embodiment of this invention. First, inputting of a CAD layout (mask pattern) into the simulator 2 is permitted in a routine ST 31 as shown in FIG. 19.

Next, inputting of simulation parameters into the simulator 2 is permitted in a routine ST 32.

Then, setting of the amount of exposure is permitted in a routine ST 33.

Then, setting of the number of optical simulations is permitted in a routine ST 34.

Next, an optical simulation is executed in a routine ST 35.

Then, computation of the value of the size of the resist pattern is performed in a routine ST 36.

In the next routine ST 37, it is determined if the number of optical simulations has reached the simulation number set in the routine ST 34. If the decision is NO, the flow goes to a routine ST 38 to execute alteration of the mask bias. If the decision is YES, on the other hand, the flow goes to a routine ST 39 to calculate MEFs.

When MEFs are calculated, extraction of portions with large MEFs is executed in a routine ST 40.

In the subsequent routine ST 41, portions with large MEFs are designated as candidates for to-be-measured portions.

The program for searching for to-be-measured portions, which includes those routines, can execute the above-described inspecting method of the first embodiment.

As apparent from the foregoing description, this invention can provide an exposure mask inspecting method which can verify the specifications of the mask CD across the mask of even an exposure mask for a semiconductor integrated circuit device having a random circuit pattern by the CD of a portion that should really be verified, and which can monitor the pattern size in an exposure area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure mask inspecting method comprising the steps of:

calculating slopes of a correlation curve of a variation in critical dimension of an exposure mask and a variation in critical dimension of a resist;

extracting portions having large slopes of said correlation curve; and selecting to-be-measured portions at which the critical dimension of said exposure mask is to be measured, from said extracted portions having large slopes of said correlation curve.

2. The exposure mask inspecting method according to claim 1, wherein said to-be-measured portions are selected in descending order of slopes of said correlation curve.

3. The exposure mask inspecting method according to claim 1, wherein said step of extracting portions having large slopes of said correlation curve includes a step of classifying slopes of said correlation curve into groups of predetermined ranges.

4. The exposure mask inspecting method according to claim 3, wherein a group of the largest slopes of said correlation curve is selected as said to-be-measured portions.

5. The exposure mask inspecting method according to claim 1, wherein said step of extracting portions having large slopes of said correlation curve includes a step of separating said exposure mask into a plurality of planar blocks.

6. The exposure mask inspecting method according to claim 5, wherein said to-be-measured portions are selected block by block.

7. The exposure mask inspecting method according to claim 1, wherein said portions having large slopes of said correlation curve are those whose slopes of said correlation curve are equal to or greater than 1.5.

8. The exposure mask inspecting method according to claim 1, wherein said slopes of said correlation curve of said variation in critical dimension of said exposure mask and said variation in critical dimension of said resist are calculated using optical simulation.

9. The exposure mask inspecting method according to claim 8, wherein a pattern of a CAD layout of an exposure mask to be used in said optical simulation is corrected in such a way that its corner portions match with a pattern of an actual exposure mask.

10. A machine-readable recording medium on which a program for searching for optimal to-be-measured portions for measuring a critical dimension of an exposure mask is recorded, said program comprising the steps of:

calculating slopes of a correlation curve of a variation in critical dimension of an exposure mask and a variation in critical dimension of a resist;

extracting portions having large slopes of said correlation curve; and designating said extracted portions having large slopes of said correlation curve as candidates for to-be-measured portions at which the critical dimension of said exposure mask is to be measured.

* * * * *